(12) United States Patent
Tan

(10) Patent No.: US 8,030,746 B2
(45) Date of Patent: Oct. 4, 2011

(54) INTEGRATED CIRCUIT PACKAGE

(75) Inventor: Chip King Tan, Perak (MY)

(73) Assignee: Infineon Technologies AG, Neubiberg (DE)

( * ) Notice: Subject to any disclaimer, the term of this patent is extended or adjusted under 35 U.S.C. 154(b) by 537 days.

(21) Appl. No.: 12/028,397

(22) Filed: Feb. 8, 2008

(65) Prior Publication Data

US 2009/0200650 A1    Aug. 13, 2009

(51) Int. Cl.
*H01L 23/02* (2006.01)
(52) U.S. Cl. .................. 257/686; 257/E21.499
(58) Field of Classification Search .......... 257/685, 257/686, 777, 723, 679, 691, 782, 786, 787, 257/790, E21.505, E23.169, E25.006, E25.013, 257/E25.018, E25.021, E25.027, E21.614, 257/E23.085, 499, 659, 678, E21.499
See application file for complete search history.

(56) References Cited

U.S. PATENT DOCUMENTS

| | | | |
|---|---|---|---|
| 5,200,601 A | 4/1993 | Jarvis | |
| 5,646,446 A | 7/1997 | Nicewarner, Jr. et al. | |
| 5,671,525 A | 9/1997 | Fidalgo | |
| 6,068,191 A | 5/2000 | Dlugosch et al. | |
| 6,239,976 B1 | 5/2001 | Templeton et al. | |
| 6,288,904 B1 | 9/2001 | Houdeau et al. | |
| 6,313,524 B1 | 11/2001 | Pueschner et al. | |
| 6,460,773 B1 | 10/2002 | Kaiya et al. | |
| 6,568,600 B1 | 5/2003 | Carpier et al. | |
| 6,798,049 B1 * | 9/2004 | Shin et al. | 257/678 |
| 6,818,978 B1 * | 11/2004 | Fan | 257/686 |
| 6,869,825 B2 | 3/2005 | Chiu | |
| 6,890,798 B2 * | 5/2005 | McMahon | 438/122 |
| 6,921,968 B2 * | 7/2005 | Chung | 257/686 |
| 6,922,780 B1 | 7/2005 | Siegel | |
| 7,176,060 B2 | 2/2007 | Yamada et al. | |
| 2005/0041402 A1 | 2/2005 | Cady et al. | |
| 2007/0252284 A1 | 11/2007 | Su | |

* cited by examiner

*Primary Examiner* — Thomas L Dickey
*Assistant Examiner* — Nikolay Yushin
(74) *Attorney, Agent, or Firm* — Dicke, Billig & Czaja, PLLC

(57) ABSTRACT

An integrated circuit package includes a substrate and a first semiconductor chip. The first semiconductor chip is provided in a cavity on a first side of the substrate. The package further includes a second semiconductor chip provided on a second side of the substrate. The first semiconductor chip and the second semiconductor chip form a stack.

16 Claims, 12 Drawing Sheets

INTEGRATED CIRCUIT PACKAGE

BACKGROUND

A chip package can be used for a smart card, for example, in a form of an integrated circuit package embedded in a smart card. The smart card is also known as an integrated circuit card (ICC) or a chip card, which is typically a pocket-sized card that can be used for financial transaction, personal identification or television encryption.

The smartcard is usually used as a portable record for one or more applications. The record is sometimes required to be updated over time via interfaces with one or more automated systems. Typically, security and confidentiality of the record is important. The smart card provides a solution for making data processing and transfer of the record to be efficient and secure.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
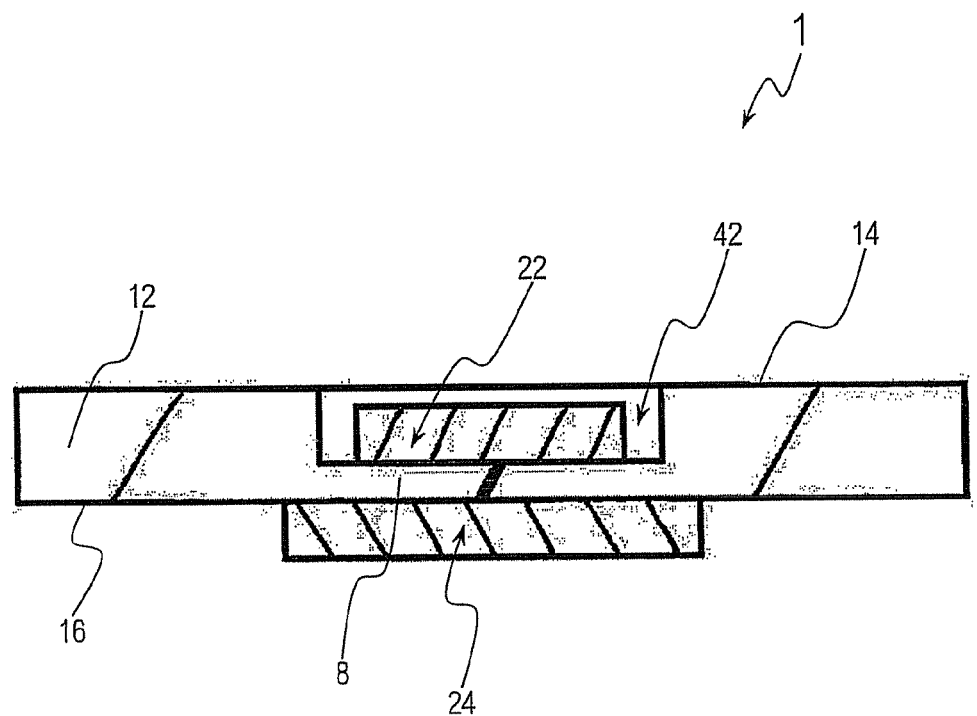
FIG. 1 illustrates a cross sectional view of a chip package.

FIG. 1 illustrates a sectioned side view of a chip package 1. The chip package 1 includes a substrate 12, a first semiconductor chip 22 and a second semiconductor chip 24. The substrate 12 includes a first side 14 and a second side 16. The first side 14 and the second side 16 are provided to be opposite to each other such that the first side 14 faces the second side 16. There is a cavity 42 provided on the first side 14 of the substrate 12. The first semiconductor chip 22 is provided in the cavity 42. The second semiconductor chip 24 is provided on the second side 16. The first semiconductor chip 22 and the second semiconductor chip 24 form a stack. There is a portion 8 of the substrate 12 provided between the first semiconductor chip 22 and the second semiconductor chip 24.

The chip package provides a thin semiconductor package 1 that is suitable to be used in applications such as smart cards, for example. Since the first semiconductor chip 22 is provided in the cavity 42, a thickness of the chip package 1 includes a thickness of the contact layer 34 (shown in FIG. 2), a thickness of the substrate 12 and a thickness of the second semiconductor chip 24. The thickness of the first semiconductor chip 22 does not contribute to the overall thickness of the chip package 1.

The chip package 1 is robust at least in part due to the portion 8 of the substrate 12 provided between the first semiconductor chip 22 and the second semiconductor chip 24. The portion 8 of the substrate 12 reinforces the first semiconductor chip 22 and the second semiconductor chip 24.

The proximity of the first semiconductor chip 22 and the second semiconductor chip 24 enables short electrical connections between the first semiconductor chip 22 and the second semiconductor chip 24. The first semiconductor chip 22 and the second semiconductor chip 24 also reinforce each other by forming a stack, as illustrated in FIG. 1. In a further embodiment, the cavity 42 can cubical in shape.

Figure 2:
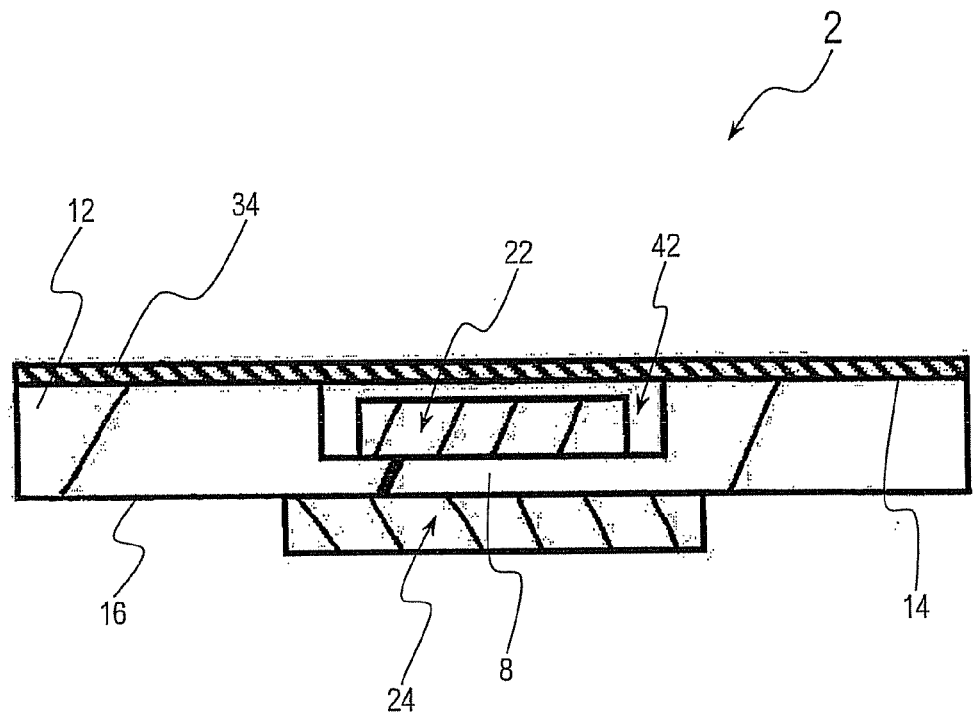
FIG. 2 illustrates a cross sectional view of a further chip package.

FIG. 2 illustrates a cross sectional view of a further chip package 2. The chip package 2 of FIG. 2 includes parts, structures, advantages and functions that are similar to the chip package 1 of FIG. 1. The similar parts are denoted by same reference numerals. Descriptions of the similar parts, structures, advantages and functions are hereby incorporated by references.

The chip package 2 includes a substrate 12, a first semiconductor chip 22, and a second semiconductor chip 24. A cavity of cubical shape 42 is provided in a middle position of the substrate 12. The cavity 42 opens towards a first contact layer 34 that are attached to the first side 14. The first contact layer 34 covers the cavity 42. The first semiconductor chip 22 is provided inside the cavity 42.

The contact layer 34 provided on the first side 14 of the chip package 2 enables the chip package 2 to be used, for example, as a micromodule for embedding into a pocket-sized card, such as a smart card. In a further embodiment, the chip package 2 can have a plurality of metallic pads, for example, eight pads in a particular embodiment that are connected to the semiconductor chips 22, 24 on the first contact layer 34, each designed to international standards for VCC (power supply voltage), RST (used to reset the microprocessor of the smart card), CLK (clock signal), GND (ground), VPP (programming or write voltage), and I/O (serial input/output line). Two pads are reserved for future use (RFU).

In a further embodiment, the chip package 2 can provide 10000 read-write cycles. A smartcard embedded with the chip package 1 can meet International Standards Organization (ISO) specifications for passing tests of dropping, flexing, abrasion, concentrated load, temperature, humidity, static electricity, chemical attack, ultra-violet, X-ray, and magnetic fields.

The chip package 2 can be provided for error correction by a Current Chip Operating Systems (COS) for performing error checking, as in a further embodiment. A terminal operating system checks two-byte status codes returned by the COS (as defined by both ISO 7816 Part 4 and the proprietary commands) after the command issued by the terminal to the smart card. The terminal then takes corrective actions.

In a further embodiment, the chip package 2 can provide EEPROM with a storage capacity of 8K-128K bit. The chip package 2 can have a chip microprocessor and a co-processor that support DES, 3-DES, RSA or ECC standards for encryption, authentication, and digital signature for non-repudiation.

The chip package 2 in a further embodiment can use an 8-bit micro-controller clockable up to 16 MHz with or without co-processor for high-speed encryption. The chip package 1 can also use controllers with a 32-bit RISC processor running at 25 to 32 MHz.

In a further embodiment, the chip package 2 can support a power source of 1.8, 3, or 5 volt DC power sources.

A smart card with the embedded chip package 2 in a further embodiment can meet relevant international or national standards. For example, the smartcard with the chip package 1 can be provided in compliance with smartcard related standards, which includes ISO7816 for identification cards, ISO 14443 for RFID cards, ISO 15693 for RFID cards, EMV 2000 version 4.00 of JCB International, MasterCard International, and Visa International, specifications of PC/SC workgroup, GSM 11.11 & 1.14 of Global System for Mobile Telecommunications standard.

In a further embodiment, the chip package 2 can be used for a contact card, a contactless card, or a contactless ticket.

Figure 3:
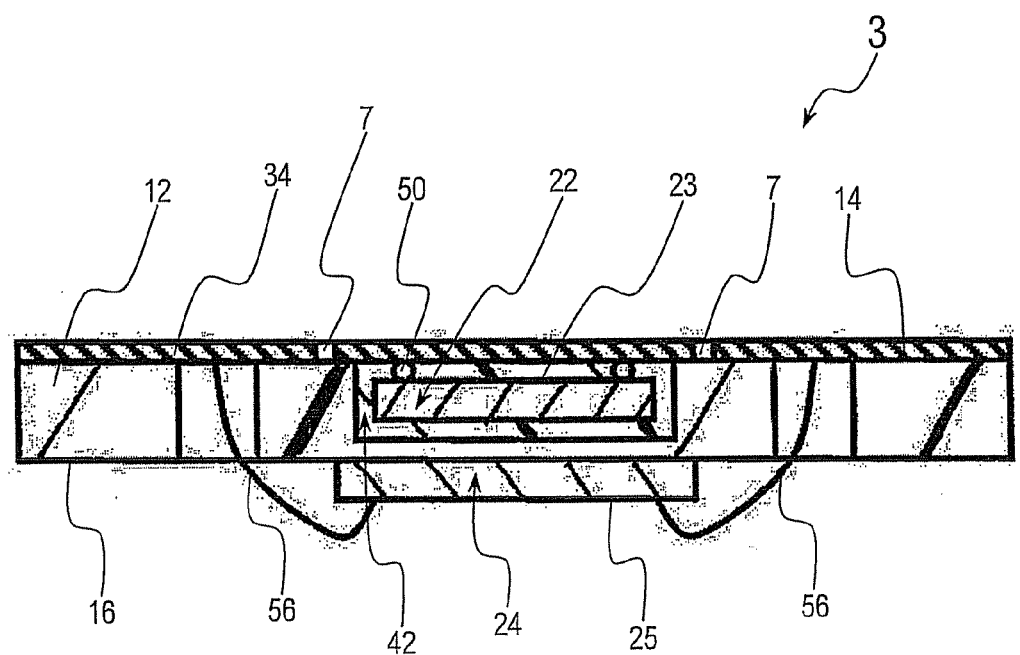
FIG. 3 illustrates a cross sectional view of a further chip package.

FIG. 3 illustrates a cross sectional view of a further chip package 3. The chip package 3 of FIG. 3 includes parts, structures, advantages and functions that are similar to the chip packages 1, 2 of FIG. 1 and FIG. 2. The similar parts are denoted by same reference numerals. Descriptions of the similar parts, structures, advantages and functions are hereby incorporated by references.

The chip package 3 includes a substrate 12, a first semiconductor chip 22, and a second semiconductor chip 24. The first semiconductor chip 22 is provided in a cavity 42 inside the substrate 12. A first contact layer 34 is attached to a first side 14 of the substrate such that the first contact layer 34 covers the first semiconductor chip 22. Terminals 7 for an antenna's connection are provided on the first contact layer 34. An active side 23 of the first semiconductor chip 23 is facing the contact layer 34. Solder balls 50 are provided between and closely attached to the first contact layer 34 and the active side 23 of the first semiconductor chip 22. An active side 25 of the second semiconductor chip 24 is also connected to the first contact layer 34 through bond wires 56.

As illustrated in FIG. 3, the active side 23 of the first semiconductor chip 22 and the active side 25 of the second semiconductor chip are stacked up such that a thickness direction of the first semiconductor chip 22 points either towards or away to the second semiconductor chip 24. In the stack that is formed by the first semiconductor chip 22 and the second semiconductor chip 24, the first semiconductor chip 22 and the second semiconductor chip 24 are both supported by the portion 8 of the substrate 12. In the stack up arrangement, the first semiconductor chip 22 and the second semiconductor chip 24 are connected to each other.

In a further embodiment, the chip package 3 of FIG. 3 can be connected to an antenna in a smart card for wireless operations. The smart card with the antenna and the chip package 3 enables contactless electronic signal communications so that applications of the contactless smart card are convenient and efficient.

When the chip package 3 is used in a contactless smart card as in a further embodiment, the first semiconductor chip 22 or the second semiconductor chip 24 can communicate with a card reader using radio-frequency identification (RFID) induction technology. The chip package 1 made for the contactless smart cards requires only close proximity to an antenna to complete a transaction. The contactless smart card are often used when transactions must be processed quickly or hands-free, such as on mass transit systems, where the smart cards can be used without even removing them from a wallet. The contactless smart card includes two types of contactless cards ("A" and "B"), which allows for communications at distances up to 10 cm or up to 50 m respectively.

The first semiconductor chip 22 is mounted onto the substrate 12 by a flip-chip technique. The flip-chip technique reduces peripheral areas for wire bonding. The flip-chip technique further provides a robust chip package. The glue 52, which is a form of molding compound, fills the void between the first semiconductor chip 22 and the cavity 42 so that the first semiconductor chip 22 is packaged inside the substrate 12 is a robust manner.

Figure 4:
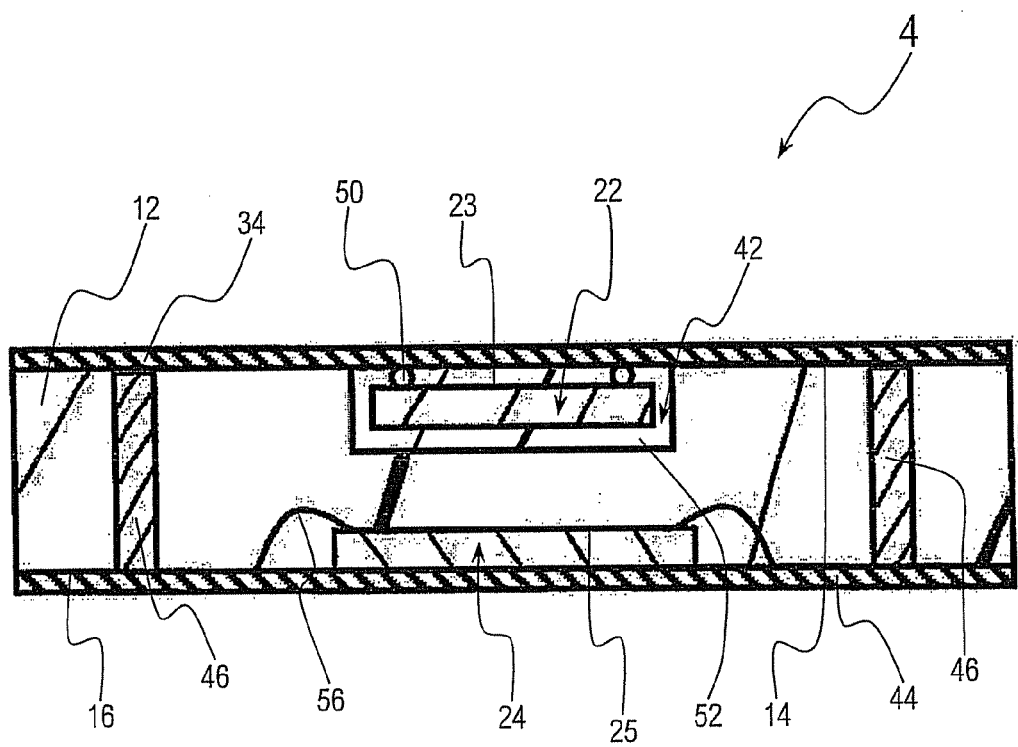
FIG. 4 illustrates a cross sectional view of a further chip package.

FIG. 4 illustrates a cross sectional view of a further chip package 4. The chip package 4 of FIG. 4 includes parts, structures, advantages and functions that are similar to the chip packages 1, 2, 3 of FIGS. 1-3 respectively. The similar parts are denoted by same reference numerals. Descriptions of the similar parts, structures, advantages and functions are hereby incorporated by references.

The chip package 4 includes a substrate 12, a first semiconductor package 22, and a second semiconductor package 24. The first semiconductor package 22 is provided inside a cavity 42 on a first side 14 of the substrate 12. The second semiconductor chip 24 is provided on a second side 16 of the substrate 12. A first contact layer 34 that is attached to the first side 14 is connected to the second contact layer 44 on the second side 16 of the substrate 12 through electrical vias 46. An active side 23 of the first semiconductor chip 22 is facing the first contact layer 34, while an active side 25 of the second semiconductor chip 24 is facing away from the second contact layer 44.

The chip package 4 provides a chip package with dual contact layers. Many electrical communication channels are provided for connecting to the chip package 4. The chip package 4 thus provides fast electronic operations. The chip package 1 is also flexible for providing the external electrical contacts.

The first semiconductor chip 22 and the second semiconductor chip 24 are provided in close proximity such that electrical interconnections through the electrical vias 46 are easily made between the first semiconductor chip 22 and the second semiconductor chip 24.

Figure 5:
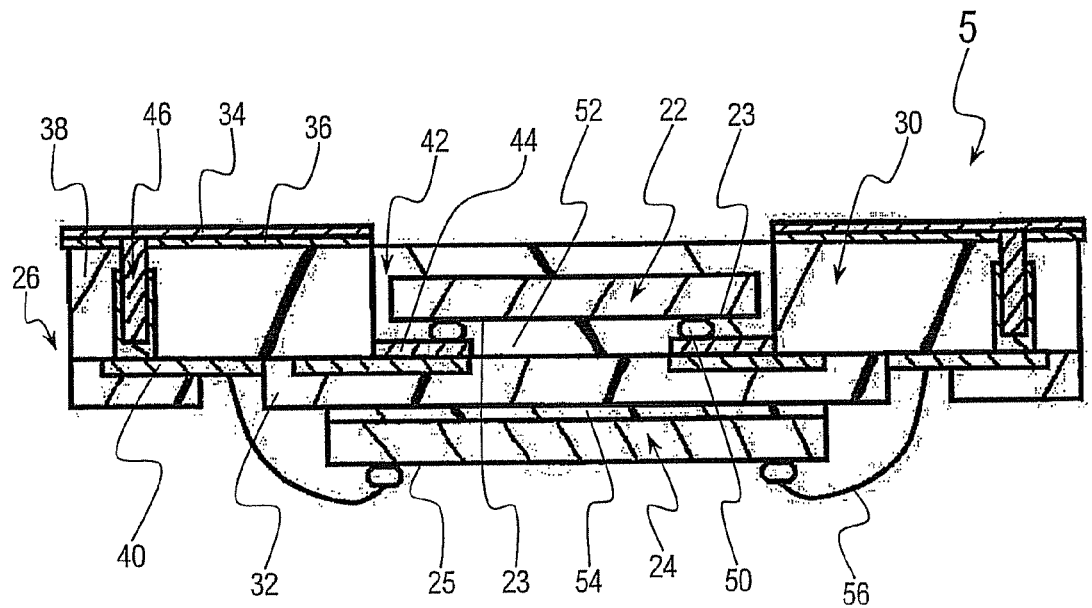
FIG. 5 illustrates a cross sectional view of a further chip package.

FIG. 5 illustrates a cross sectional view of a further chip package 5. The chip package 5 includes parts, structures, advantages and functions that are similar to the chip packages 1-4 of FIGS. 1-4 respectively. The similar parts are denoted by same reference numerals. Descriptions of the similar parts, structures, advantages and functions are hereby incorporated by references.

The chip package 5 includes a first semiconductor chip 22, a second semiconductor chip 24, and a dual core substrate 26. The dual core substrate 26 includes a first core layer 30 and a second core layer 32 that are closely attached to each other at their broad sides. The first core layer 30 includes a first contact layer 34, a first copper layer 36, a polyethylene terephthalate (PET) layer 38, a second copper layer 40, and a second contact layer 44. The first contact layer 34, the first copper layer 36, the polyethylene terephthalate (PET) layer 38, and the second copper layer 44 are sequentially attached to each other on their broad sides in a sequentially manner. The first copper layer 36 and the second copper layer 40 are connected by electrical vias 46.

There is provided a cavity that passes through the first contact layer 34, the first copper layer 36, and the PET layer 38. The second contact layer 44 is provided on top of the second copper layer 40. The second contact layer 44 and the second copper layer 40 provide a base for the cavity. Glue 52 is filled between the first semiconductor chip 22 and the cavity 42. Solder balls 50 are provided between an active side 23 of the first semiconductor chip 22 and the second contact layer 50.

A die bonding adhesive 54 is provided on the second core layer 32 in a central area. The second semiconductor chip 24 is attached to the second core layer 32 through the die bonding adhesive 54. An active side 25 of the second semiconductor chip 24 is connected to the second copper layer 40 through bond wires 56.

The chip package 5 of FIG. 5 provides two semiconductor chips 22, 24 in a single semiconductor package. In a further embodiment, the first semiconductor chip 22 can be a memory chip, while the second semiconductor 24 can be a controller chip. Therefore, the chip package 5 can perform advanced electronic functions for providing complex tasks in the further embodiment. The cavity 42 is the first core layer 30 reduces a thickness of the chip package 30 because the first semiconductor package 22 in the cavity 42 does not contribute to the thickness.

Figure 6:
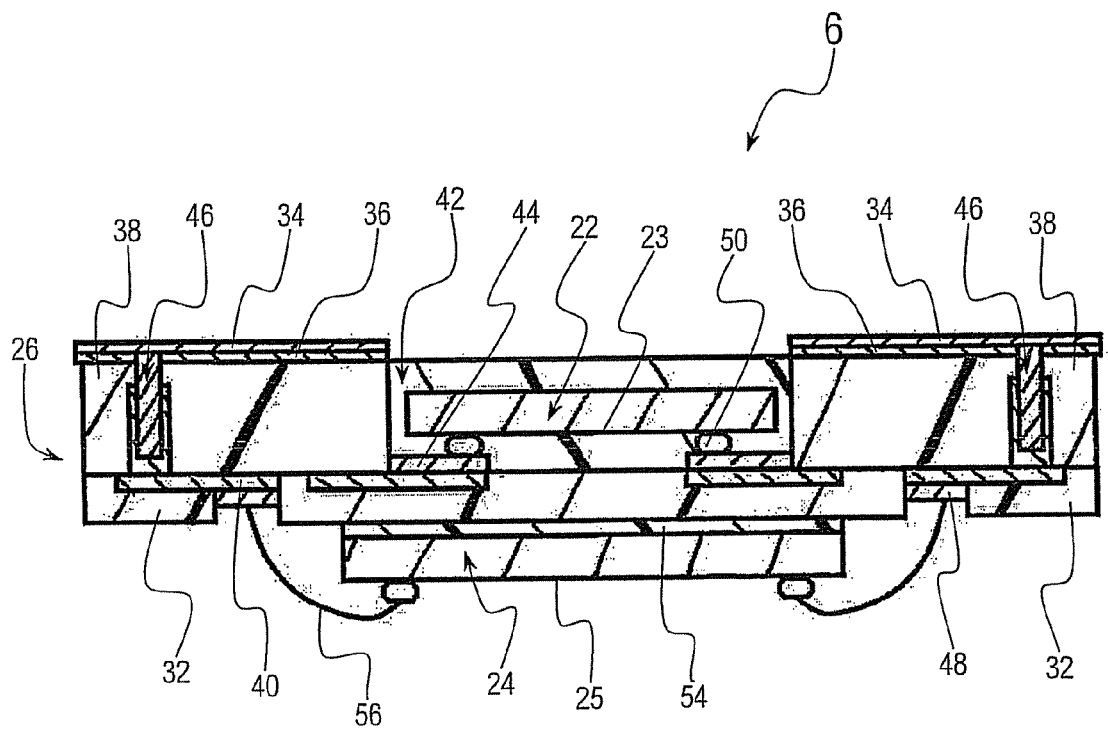
FIG. 6 illustrates a cross sectional view of a further chip package.

FIG. 6 illustrates a cross sectional view of a further chip package 6. The chip package 6 includes parts, structures, advantages and functions that are similar to the chip packages 1-5 of FIGS. 1-5 respectively. The similar parts are denoted by same reference numerals. Descriptions of the similar parts, structures, advantages and functions are hereby incorporated by references.

The chip package 6 includes a first semiconductor chip 22, a second semiconductor chip 24, and a dual core substrate 26. The first semiconductor chip 22 is attached to a second contact layer 44 in a cavity 42 of the dual core substrate 26. An active side 25 of the second semiconductor chip 24 is connected to a third contact layer 48 through bond wires 56. An active side 23 of the first semiconductor chip 22 is facing the second semiconductor chip 24. The active side 23 of the first semiconductor chip 22 is electrically connected to the active side 25 of the second semiconductor chip 24 through the solder balls 50, the second contact layer 44, the second copper layer 40, the third contact layer 48, and the bond wires 56.

In a further embodiment, the first semiconductor chip 22 can function either independently from or corporately with the second semiconductor chip 24. Furthermore, the chip package 6 can be modified to provide a dual interface smart card by using the first contact layer 34 and the third contact layer 48. The second core layer 32 between the first semiconductor chip 22 and the second semiconductor chip 24 reinforces the chip package 5 so that the chip package 5 is strong.

Figure 7:
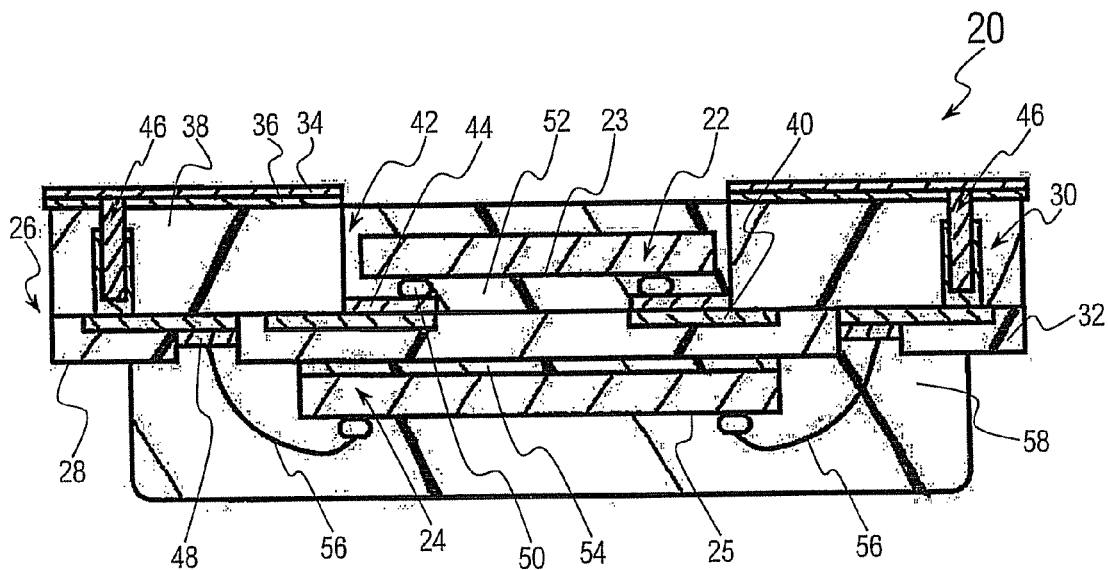
FIG. 7 illustrates a cross sectional view of a further chip package.

FIG. 7 illustrates a cross sectional view of a further chip package 20. The chip package 20 includes parts, structures, advantages and functions that are similar to the chip packages 1-6 of FIGS. 1-6 respectively. The similar parts are denoted by same reference numerals.

The chip package 20 includes a memory chip 22, a controller chip 24, and a dual core substrate 26. The memory chip 22 is provided at a middle position of the dual core substrate 26 in a lateral direction and the memory chip 22 is also surrounded by the dual core substrate 26. The controller chip 24 is provided on a bottom side 28 of the dual core substrate 26.

The dual core substrate 26 is in a sheet form with multiple core layers 30, 32. The dual core substrate 26 includes a first core layer 30 and a second core layer 32 that are also in sheet forms respectively. The first core layer 30 is placed on top of the second core layer 32, and the two core layers 30, 32 are closely attached to each other on their broad sides. The first core layer 30 is thicker than the second core layer 32, while the broad sides of the first core layer 30 and the second core layer 32 are of similar sizes in the lateral direction.

The first core layer 30 includes five closely attached layers 34, 36, 38, 40, 44. The five layers 34, 36, 38, 40, 44 are a first contact layer 34, a first copper layer 36, a polyethylene terephthalate (PET) layer 38, a second copper layer 40, and a second contact layer 44. A top layer of the first core layer 26 is the first contact layer 34 that is a thin layer of Nickel-Gold (NiAu). The first copper layer 36 is placed immediately below the first contact layer 34. The first copper layer 36 is thicker than the first contact layer 34.

The PET layer 38 is placed further below the first copper layer 36. The second copper layer 40 is provided yet below the PET layer 38. The PET layer is the thickest among the four layers 34, 36, 38, 40 of the first core layer 26. A cavity 42 is provided at the middle position of the first core layer 26 such that the cavity 42 opens a well towards top and the cavity 42 passes through the first contact layer 34, the first copper layer 36 and the PET layer 38. The second copper layer 40 is provided as a bottom of the cavity 42. A top surface of the base that is exposed by the cavity 42 is provided with the second contact layer 44. The second contact layer 44 is closely attached to the second copper layer 40.

A plurality of electrical vias 46 is further provided around the cavity 42 such that the first copper layer 36 and the second copper layer 40 are joined by the plurality of electrical vias 46 according to a predetermined pattern. In FIG. 7, two blind vias 46 are sectioned and exposed for visualizing the connection, but there are more electrically conductive vias possible to be provided.

The second core layer 32 includes a single layer of surface mount material and the second core layer 32 is closely attached to the second copper layer 40 extending across the broad side of the first core layer 30. Portions of the second copper layer 40 are exposed by the second core layer 32 such that the exposed portions are plated with thin layers of Nickel-Gold, termed as a third contact layer 48.

The memory chip 22 is provided on a plurality of solder balls 50 at its active side 23. The plurality of solder balls 50 is attached to the second contact layer 44. The memory chip 22 is completely sealed inside the cavity 42 by glue 52. The glue 52 fills void between the dual core substrate 26 and the memory chip 22 inside the cavity 42.

The controller chip 24 is mounted onto a bottom side of the second core layer 32. A layer of die mounting adhesive 54 is provided between the second core layer 32 and the controller chip 24 for attaching the controller chip 24 to the second core layer 32. The layer of die mounting adhesive 54 is of comparable size as an active side 25 of the controller chip 24. The controller chip 24 is placed below the memory chip 22 in a stack up structure. Furthermore, the controller chip 24 is surrounded by the third contact layer 48. The controller chip 24 is also electrically connected to the third contact layer 48 via bond wires 56. Only two of the bond wires 56 are made visible in FIG. 7. The bond wires 56, the die bonding adhesive 54, the controller chip 24 and the third contact layer 48 are encapsulated by a molding compound 58. The molding compound 58 forms a cubical solid structure on the second core layer 28.

Figure 8:
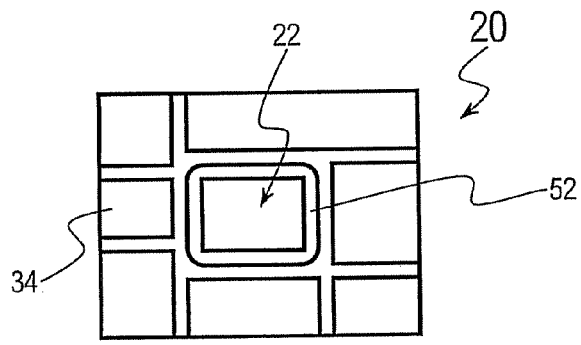
FIG. 8 illustrates an exposed top view of the chip package.

FIG. 8 illustrates an exposed top view of the chip package 20. In a center region of the chip package 20, the memory chip 22 is exposed as a rectangular patch. The memory chip 22 is encapsulated by the glue 52 such that the glue 52 separates the memory chip 22 from the surrounding first contact layer 34. The exposed top view also illustrates that the first contact layer 34 includes seven distinctive patches. Narrow slots are provided between the seven patches for dividing the seven patches. The seven patches cover substantially the topside of the chip package 20.

Figure 9:
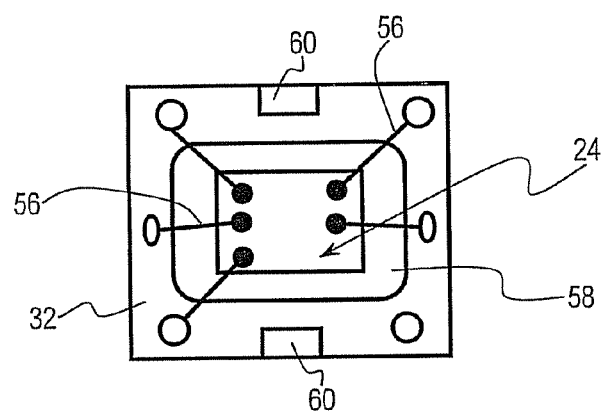
FIG. 9 illustrates an exposed bottom view of the chip package.

FIG. 9 illustrates an exposed bottom view of the chip package 20. The bottom view illustrates three encircling areas 32, 58, 24 in rectangular forms. An outer encircling area 32 is exposed part of the second core layer 32. A middle encircling area 58 is the molding compound 58. The central area 24 is the exposed controller chip 24 in a substantially rectangular form. There are five bond wires 56 illustrated to connect the controller chip 24 to third contact layer 48. Two small rectangular patches 60 of the third contact layer 48 are exposed at two opposite edges of the second core layer 32.

The chip package 20 incorporates both the memory chip 22 and the controller chip 24 into a single chip package. Two different electronic functions are provided in the single chip package 20 for a smart card so that many advanced applications is flexibly implemented and configured. In a further embodiment, a smart card having the chip package 20 can be more versatile in electronic functions that involve logic, memory and signal processing.

The memory chip 22 and the controller chip 24 are mounted in the stack up structure with the dual core substrate 26 such that the memory chip 22 and the controller chip 24 reinforce each other. The chip package 20 is made more robust by encapsulation materials 52, 58, which include the glue 52 and the molding compound 58. This arrangement reduces die crack issue, which is frequently found in chip packages for smart cards. The die crack issue often occurs when a chip package having a single memory chip or a controller chip that has either a passive side or an active side protected by a molding compound, but not both.

The chip package 20 employs the dual core substrate 26, which has comparable thickness as compared to a chip package of a smart card that has a single core layer. The memory chip 22 of the chip package 20 is buried inside the dual core substrate 26 such that a total thickness of the chip package 20 is less than a sum of thickness of the memory chip 22, the dual core substrate 26, and the controller chip 24. In the embodiment, the thickness measured from a top surface of the first contact layer 34 to an exposed surface 28 of the second core layer 32 is 0.35 mm, while the thickness measured from the exposed surface 28 of the second core layer 32 to a bottom surface of the molding compound 58 is 0.23 mm. Hence, the chip package 20 is made as thin as 0.6 mm, which is similar to a known chip package with a single chip for a smart card.

The first contact layer 34 provides external electrical connections to the memory chip 22 and the controller chip 24. The separated patches of the first contact layer 34 can either be shared or divided for electrically connecting the memory chip 22 and the controller chip 24. Therefore, the first contact layer 24 provides an interface for the chip package 20. The two exposed small patches 60 of the third contact layer 48 are reserved for providing solder connection to the memory chip 22.

In short, as in a further embodiment, a smart card with the chip package can be more advanced in electronic functions, more flexible in interconnections, more compact in thickness and more robust in manufacturing handling and user application.

Alternatively, the chip package 20 is provided with dual interfaces for external electrical contacting. In addition to the first contact layer 34, another contact layer can be provided on the exposed portions of the second core layer 32 in a further embodiment. The other contact layer can be connected to the second copper layer 40 through electrically conductive vias or bond wires. As a result, the chip package 20 can be provided with dual interfaces to the memory chip 22 and the controller chip 24 for external electrical contacting. The dual interfaces facilitate more communication channels for complex electronic functions as compared to the known single interface arrangement.

Electrical conductive vias, which are a form of electrical connecting elements are through-substrate conductive channels, which connects tracks on opposite surfaces of a substrate together. In the chip package 20, the blind vias 46 connect opposite sides of the first core layer 30 by an electrically conductive material. Small particles or powder can be used for solid filling the blind vias. Materials of the small particles or powder can be alumina ($Al_2O_3$), aluminum nitride (AlN) and beryllium oxide (BeO), solid Nickel-Gold (Au), solid silver (Ag) or solid copper-tungsten (CuW).

The first core layer 30, the second core layer 32 and the molding compound 58 can be flexible materials so that a slight distortion of the chip package 20 will be less likely to cause the chip package 20 to crack. A cracked chip package may result failure of electronic functions of the chip package.

The memory chip 22 is mounted to the second contact layer 44 by flip-chip method. The memory chip 22 can also be mounted to the second contact layer 44 by other known methods, such as using a lead frame with wire bonding. Similarly, the controller chip 24 can also be mounted to the substrate by other known methods, such as using a lead frame. An example of using the lead frame is known as Chip-On-Lead technique.

The chip package 20 can also be made for a contactless smart card, in which the controller chip 24 and the memory chip 22 communicate with a card reader through radio-frequency identification (RFID) induction technology. The chip package 20 made for the contactless smart cards requires only close proximity to an antenna to complete a transaction. The contactless smart card are often used when transactions must be processed quickly or hands-free, such as on mass transit systems, where the smart cards can be used without even removing them from a wallet. The standard for contactless smart card communications is ISO/IEC 14443, which defines two types of contactless cards for allowing for communications at distances up to 10 cm. An alternative standard for contactless smart cards is ISO 15693, which allows communications at distances up to 50 cm.

The bond wires 56 can be replaced by bond strips. Both bond wires and bond strips are forms of electrical connecting elements. Materials suitable for making the bond wires 56 or bond strips are gold, nickel-gold, aluminum, copper, or any alloy of these materials. The bond wires 56 or bond strips can be joined to the controller chip by ball bonding technique, wedge bonding technique or tab bonding technique. The solder balls 50, which are a form of electrical connecting elements can also be replaced electrical connecting pins with adaptation to a base for connecting the first semiconductor chip 22.

The glue 52 can be replaced by epoxy compound, resins or other suitable adhesives that are used to encapsulate integrated circuits for the chip package 20.

The Nickel-Gold material provided for the first contact layer 34, the second contact layer 44 and the third contact layer 48 can be used where Nickel is provided onto a copper base before the Nickel-Gold material. Adhesion of the Nickel-Gold material to the copper base can thus be improved. Alternatively, the Nickel-Gold material can be replaced by a Palladium-Nickel-Gold material.

The first core layer 30 can use a high heat resistant coating material that forms high reliable film by drying at below 200° C. A film of the first core layer 30 is suitable for various electronic parts and semiconductor devices by excellent flexibility, toughness and low warpage. The second core layer 32 can be made of a solder resist material.

The chip package 20 provides both the memory chip 22 and the controller chip 24 for a smart card. The memory chip 22 includes non-volatile memory storage components and some specific security logic. The memory chip 22 is used for storing coded data for computing. The controller chip 24 performs computation for data or control signal processing. The memory chip 22 and the controller chip 24 are interconnected to each other for carrying out electronic functions of the chip package 20, such as personal identification or financial transactions.

The glue 52 not only seals the memory chip 22 from external environment to against any shocks or electrical discharges, but also protects the memory chip 22 from unwanted disturbance, such as scratching and dirt infiltration. The glue 52 also provides electrical insulation to the memory chip 22.

The Nickel-Gold material of the first contact layer 34, the second contact layer 44 and the third contact layer 48 are resistive to oxidization and contamination, which is common for smart card usage. The contamination includes oil, grease, sweat, or ink, etc. The Nickel-Gold material also provides good electrical connection with small electric resistance to neighboring copper materials on the first copper layer 36 and the second copper layer 40. The Nickel-Gold material on the second contact layer 40 further provides good electrical conduction to the solder balls 50 that electrically connect to the memory chip 22. The bond wires 56 that are made of gold also provide excellent electrical bonding to the controller chip 24.

The electrical conductive blind vias 46 eliminate epoxy and/or solder extrusion during assembly process. The electrical conductive blind vias 46 also provide a planar and low-resistance microwave-grounding path for offering a high thermal conductivity cooling path.

The die bonding adhesive 54 is provided for attaching the controller chip 24 to the second core layer 32 at low temperature and low pressure within short time. The die bonding adhesive 54 also provides resistance to package cracking during wire bonding.

The molding compound 58 encapsulates the controller chip 24 and the bond wires 56 for preventing physical damage or corrosion to the controller chip 24 and the bond wires 56. Similarly, the glue 52, which is a form of molding compound, protects the memory chip 22 from injury.

The first core layer 30 and the second core layer 32 provide robust and resilient support bases for the memory chip 22 and the controller chip 24. The first core layer 30 and the second core layer 24 also conduct heat away from the memory chip 22 and the controller chip 24 during electronic operation of the chip package 20.

Figure 10:
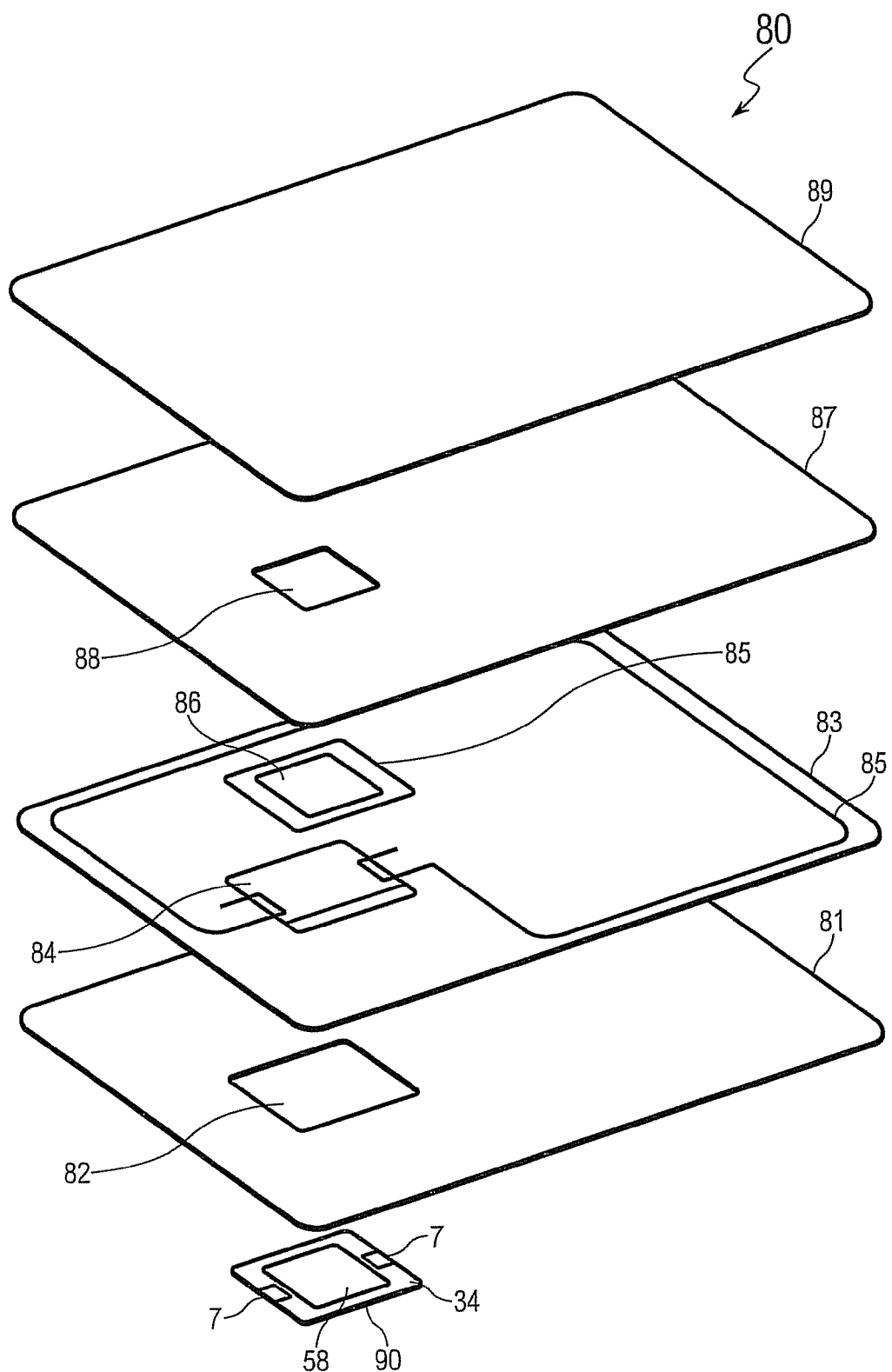
FIG. 10 illustrates an exploded view of a contactless smart card with a chip package.

FIG. 10 illustrates an exploded view of a contactless smart card 80 with a chip package 90. The chip package 90 of the smart card 80 can adapted from one of the previously described chip packages 1-6, 20. The smart card includes a stack of several foils 81, 83, 87, 89 that includes a front cover foil 81, an antenna foil 83, a core foil 87, and a backside cover foil 89. The front cover foil 81 includes a first hole 82 for receiving the chip package 90 at a predetermined location. The antenna foil 83 is attached to the front cover foil 81 such that a substantially rectangular angular hole 82 of a corresponding size matches the first hole 82 on the front cover foil 81. An antenna 85 in a loop form is provided on a side of the antenna foil 83 such that ends of the antenna is connected to predetermined terminals 7 of the contact layer 34 of the chip package 90. A hot melt sheet 85 that has a central hole 86 is adhered to the antenna foil 83 at the second hole 84 for fixing the ends. The core foil 87 with a third hole 88 is further provided on the antenna foil 83 such that the third hole 88 of the core foil 87 receives the molding compound 58. The backside cover foil 89 that is adhered to the core foil 87 is provided at a bottom side of the smart card 80. The smart card 80 can be provided by mature and efficient manufacturing techniques. The smart card 80 can provide advanced functions of data storage and signal processing.

FIGS. 11-24 illustrates a method of making the chip package for the smart card of the embodiment illustrated in FIGS. 7-10. A summary of the processes for making the chip package 20 is illustrated in FIG. 25.

Figure 11:
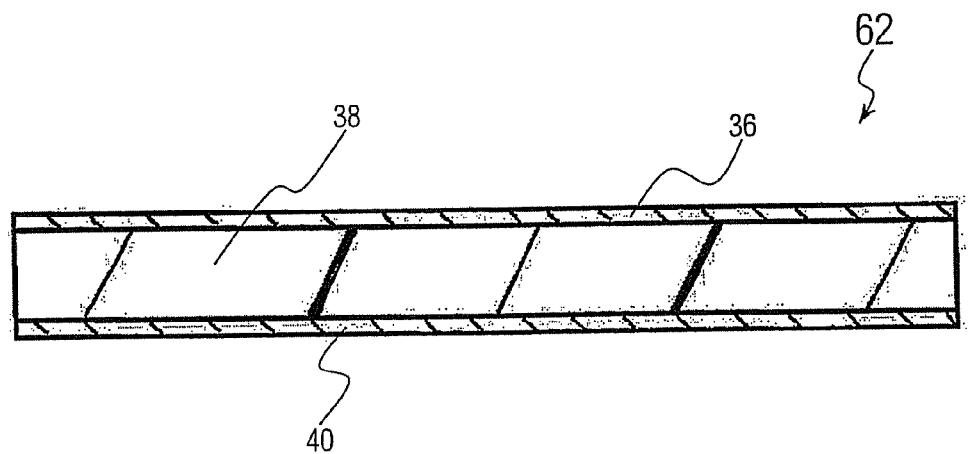
FIG. 11 illustrates a sectioned side view of a first core layer material for making the chip package.

FIG. 11 illustrates a sectioned side view of a first core layer material 62 for making the chip package 20. A first process 110 of making the chip package 20 is to provide the first core layer material 62. The first core layer material 62 includes the first copper layer 36, the PET layer 38, and the second copper layer 40. The first copper layer 36, the PET layer 38, and the second copper layer 40 extends across their broad sides in a lateral direction with a same size, as illustrated in FIG. 11. The first copper layer 36, the PET layer 38, and the second copper layer 40 are stacked up in their thickness direction. The first copper layer 36 is provided to be on top, the PET layer 38 is provided to be in a middle position, while the second copper layer 40 is provided to be further below the PET layer 40 at bottom. The first copper layer 36, the PET layer 38 and the second copper layer 40 are closely attached to each other on their broad sides. The first copper layer 36 and the second copper layer 40 are provided with similar thickness. The PET layer 38 is the thickest among the first copper layer 36, the PET layer 38 and the second copper layer 40.

The PET layer 38 includes PET material, which is a type of polyesters or thermoplastic material that also includes polybutylene terephthalate (PBT). The polyester resin combines excellent mechanical, electrical and thermal properties with very good chemical resistance and dimensional stability. The polyester resin also offers low moisture absorption and has good flow properties. Specialist Grades of the polyester resin can be designed to minimize warpage, maximize impact strength or optimize surface quality. A range of the polyester resin also includes grades for applications that typically require higher strength and or higher heat resistance. PBT, PET, and PBT Blends are engineering plastics with excellent processing characteristics and high strength and rigidity for a broad range of applications. The PET and PBT materials have extreme low water absorption, in particular comparison to nylon (Polyamides). The PET and PBT materials also have exceptional dimensional stability, due to the low water absorption. The PET and PBT materials further possess excellent electrical properties and excellent resistance to chemical attack and high environmental stress crack resistance, in particular in comparison to polycarbonates, due to the semi-crystalline nature of polyesters. In addition, the PET and PBT materials have very good heat and heat ageing resistance, very low creep, even at elevated temperatures, very good color stability, and excellent wear properties.

Copper material is used for the first copper layer 36 and the second copper layer 40. Copper is provided as a ductile metal with excellent electrical conductivity and heat conductivity.

The PET layer 38 can be replaced by another layer or a compilation of layers which is/are electrically non-conductive, flexible, robust and resistive to corrosion. The first copper layer 36 and the second copper layer 40 can also be replaced by other layers of materials, which are electrically conductive. The PET layer 38 provides strong frame of support to the dual core substrate 26 of the chip package 20. The PET layer 38 also adheres the first copper layer 36 and the second layer 40 onto its opposite surfaces together.

Figure 12:
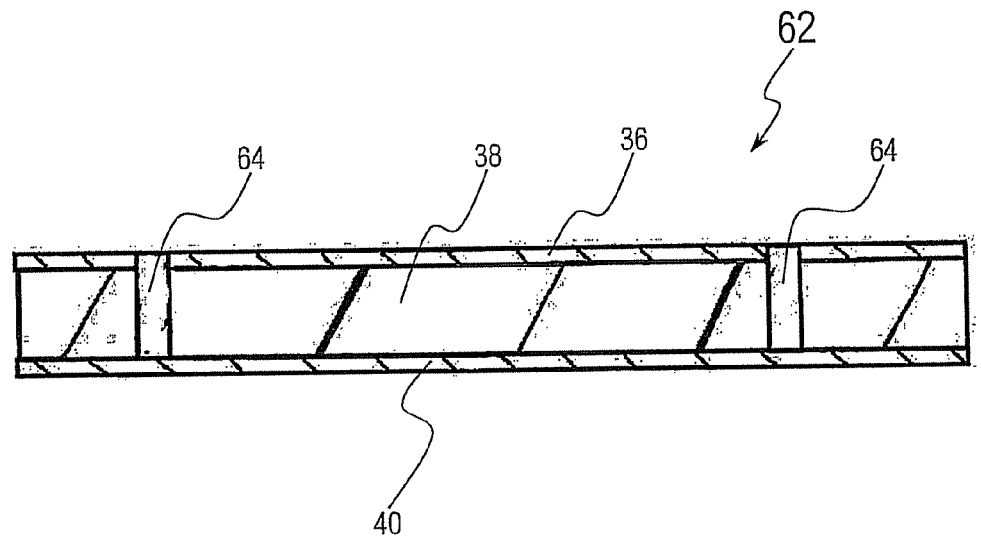
FIG. 12 illustrates a sectioned side view of the first core layer material with through core layer channels.
Figure 13:
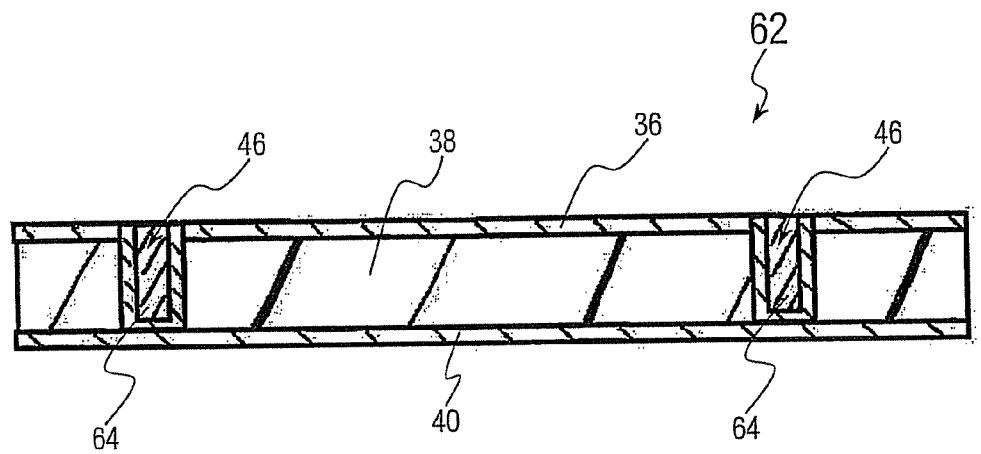
FIG. 13 illustrates a sectioned side view of the first core layer material with solid filled electrical vias.

FIG. 12 and FIG. 13 illustrate an example of a process 120 of providing electrical vias 46 in the first core layer material 62. In FIG. 12, there is illustrated a sectioned side view of the first core layer material 62 with through core layer channels 64. The through core layer channels 64 are a plurality of wells or blind holes that open through the first copper layer 36 and the PET layer 38. The second copper layer 40 is provided as bottoms of the through core layer channels 64. The through core layer channels 64 are distributed over the broad side of the first core layer material 62. The through core layer channels 64 are cylindrical openings with a same diameter.

The through core layer channels 64 are provided by machining through the first core layer 62 at predetermined locations. The machining is conducted through three stages. In a first stage, a computer numerical control (CNC) machine moves a drill bit for copper material to the predetermined locations and rotates downwardly to penetrate though the first copper layer 36. In a second stage, the CNC machine moves another drill bit to the predetermined locations and rotates downwardly to drill through the PET layer 38. In a third stage, the CNC machine moves an endmill back to these predetermined positions to clean up these through core layer channels 64. These through core layer channels 64 can be further cleaned by vacuum sucking, fluid rinsing, etc. As alternatives, these through core layer channels 64 can be provided through multi-stage chemical etchings or in combination with machining.

FIG. 13 illustrates a sectioned side view of the first core layer material 62 with solid filled blind vias 46. The blind vias 46 are electrically conductive channels which bridge the first copper layer 36 and the second copper layer 40 together to form an electrical conductive pathway. The blind vias 46 are identical in structure, size and material in the illustrated embodiment. Each of the blind vias 46 is provided in a form of a cylindrical tube with a base. Each of the cylindrical tube is solid material filled. Top edges of each of the blind vias 46 are provided to be level with the first copper layer 36. Tube walls of each blind vias 46 are provided to be closely fitted to their respective through core layer channels 64. The base is provided to be closely attached to topside of the second copper layer 40 and is also joined to the tube wall. The solid material for filling the blind vias 46 is copper (Cu) powder. The copper powder is dispensed into each of the through core layer channels 64 by a spattering process. The first core layer material 62 is further processed such that the top edges of the blind vias 46 are made even with the first copper layer 36.

The blind vias 46 provide a compact form of electrical connection between multiple layers 36, 38, 40. Utilization of blind vias 46 can avoid bond wires connection which can cause complexity in connection and bulkiness in construction.

Figure 14:
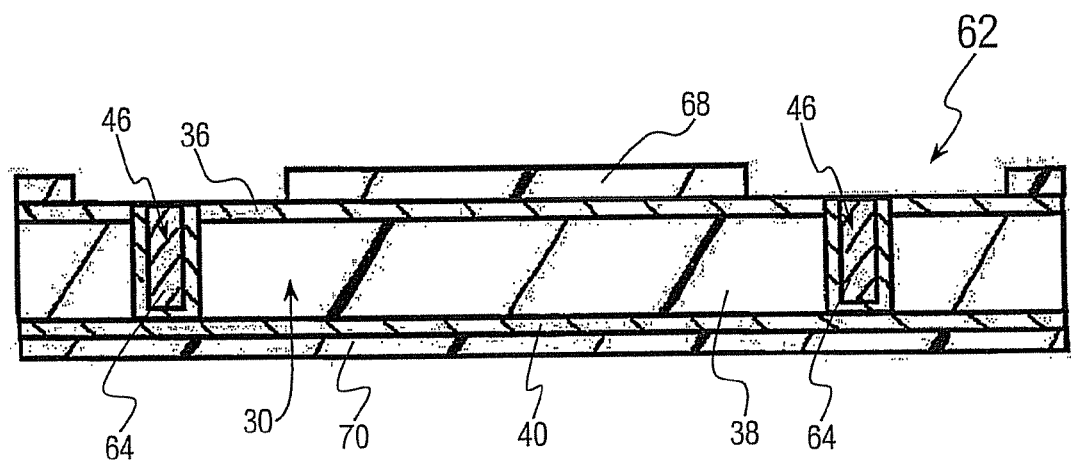
FIG. 14 illustrates a sectioned side view of the first core layer material with photoresist films applied at a first time.

FIG. 14 illustrates a sectioned side view of the first core layer material 62 with photoresist films 68, 70 applied at a first time. There is a first top photoresist film 68 provided on top of the first copper layer 36 and a first bottom photoresist film 70 provided at bottom of the second copper layer 40. The first top photoresist film 36 and the first bottom photoresist film 40 are provided with a same thickness. The first top photoresist film 68 includes a predetermined pattern which expose parts of the first copper layer 36. In particular, these parts expose vicinity areas of the blind vias 46. The first bottom photoresist film 70 is provided to cover the entire broad surface of the second copper layer 70 at bottom.

The first top photoresist film 68 exposes parts on the first copper layer 36 for processing. The first top photoresist film 68 and the first bottom photoresist film 70 also cover areas that should be prevented for the processing. The first top photoresist film 68 and the first bottom photoresist film 70 can be applied in a convenient manner, which is done reliably at low cost.

A process 130 of applying photoresist films provides the first top photoresist film 68 and the first bottom photoresist film 70 onto the first core layer material 62. Photoresist covers the topside of the first copper layer 36 with a thin photoresist film. The photoresist also covers the bottom side of the second copper layer 40 with a tin photoresist film 70. The photoresist is a very viscous polymer as a positive type of photoresist. Positive photoresist is a type of photoresist in which a portion of the photoresist that is exposed to ultraviolet light becomes soluble to a photoresist developer and a portion of the photoresist that is unexposed remains insoluble to the photoresist developer. A mask is further put on top of the thin photoresist film on the first copper layer 36. The mask has a predetermined pattern that exposes patches of the first copper layer. In particular, these patches expose vicinity parts of the blind vias 46. An ultraviolet light is later projected onto the mask, the thin photoresist film on the first copper layer 36 and the thin photoresist film on the second copper layer 40. The mask-covered thin photoresist film is exposed under the ultraviolet light for a predetermined period of time. After the exposure, the mask is removed and the exposed parts of the photoresist films are dissolved away by a photoresist developer. The thin bottom photoresist film 70 is completely covered by a mask and is not exposed under the ultraviolet light.

Application of the first photoresist is very convenient for defining certain patterns on first core layer 30. The photoresist films 68, 70 can also be efficiently and accurately provided by computerized production lines. The photoresist and photoresist developer are widely available. Light-curing and dissolving techniques of the photoresist or photoresist material are mature and adopted in semiconductor manufacturing industry. Alternatively, the exposure under ultraviolet light of the photoresist films 68, 70 can be replaced by the exposure under electron beams. A main difference between the two different types of exposure is that while photons are absorbed, depositing all their energy at once, electrons deposit their energy gradually, and scatter within the photoresist during this process. One positive photoresist used with I, G and H-lines from a mercury-vapor lamp is based on a mixture of Diazonaphthoquinone (DNQ) and Novolac resin (a phenol formaldehyde resin). DNQ-novolac photoresist materials are developed by dissolution in a basic solution (usually 0.26N tetramethyl ammonium hydroxide in water).

Figure 15:
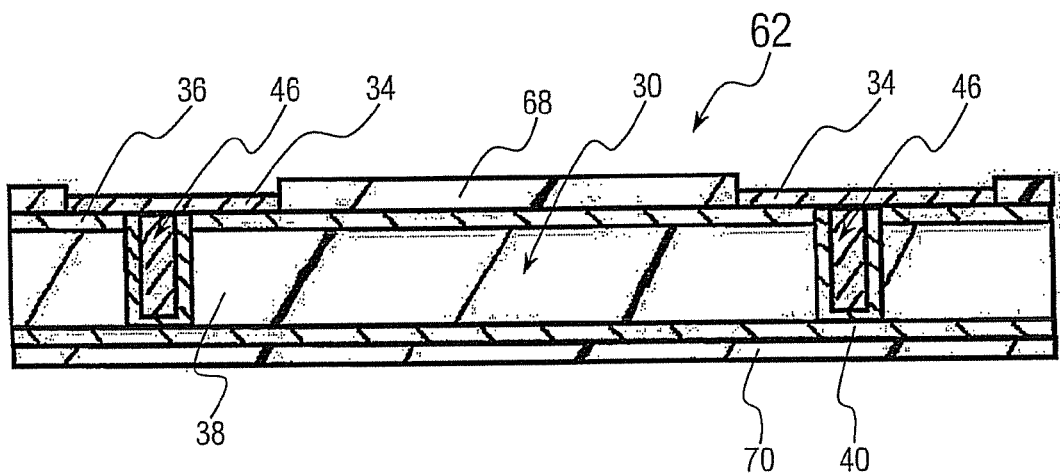
FIG. 15 illustrates a sectioned side view of the first core layer material with a Nickel-Gold (NiAu) layer on a first side.

FIG. 15 illustrates a sectioned side view of the first core layer material 62 with the first contact layer 34 on a first side. The first contact layer is made of Nickel-Gold, which is provided onto the exposed parts of the first copper layer 36. The first contact layer 34 is thinner than the first photoresist film 68. The first contact layer 34 is an electrical conductive layer, which is connected and closely attached to the first copper layer 36. The first contact layer 34 is resistive to chemical etching, scratching and other forms of contamination. The first contact layer 34 provides a reliable layer for electrical contacting.

A process 140 of providing the first contact layer 34 includes sequential immersion of the first core layer 30 through a series of wet chemical baths. With careful control of plating parameters, a layer of Nickel-Gold material is deposited on the exposed parts on the first copper layer 36. The plating of Nickel-Gold layer may be preceded by plating a layer of nickel so that adhesion of Nickel-Gold material to the copper is improved. The process 140 of providing the first contact layer 34 is a mature technique, which can be conveniently introduced at low cost. Other plating processes for applying the Nickel-Gold layer are also available. For example, the first contact layer 34 can be deposited by electroplating.

Figure 16:
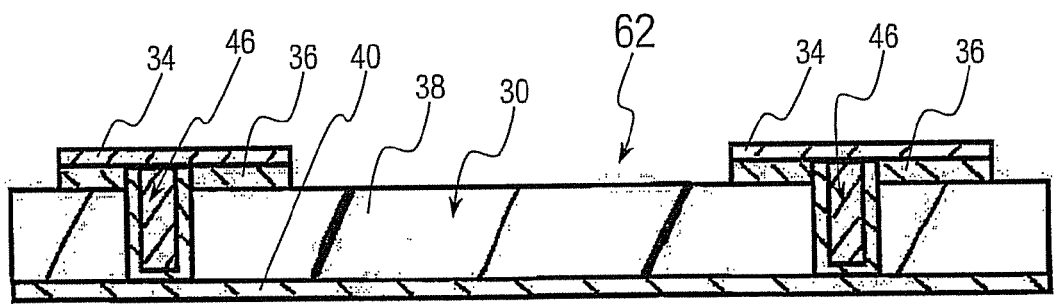
FIG. 16 illustrates a sectioned side view of the first core layer material having parts of the first copper layer removed.

FIG. 16 illustrates a sectioned side view of the first core layer material 62 having parts of the first copper layer removed. The parts of the first copper layer 36 that are not covered by the first contact layer 36 are removed. As a result, each part of the remaining first copper layer 36 is attached to at least one part of the first contact layer 34 and at least one blind via 46.

A process 150 of removing the parts of the first copper layer 36 includes dry film stripping and etching. The dry film stripping is carried out by a dry film stripping system for removing the photoresist films 68, 70. The dry film stripping system creates plasma with gaseous atomic oxygen to remove cured photoresist. This is also known as "ashing", which resembles dry etching. Alternatively, a liquid called "resist stripper" can be applied onto the first core layer. The liquid chemically alters the cured photoresist material so that the cured photoresist material no longer adheres to the first core layer 62.

The etching of the first copper layer 36 is carried out by applying ferric chloride acid ($FeCl_3$) onto the exposed areas of the first copper layer 36. The parts which are under the first contact layer 34 are protected and are not affected by the $FeCl_3$.

The dry film stripped and copper etched first core layer 36 of FIG. 16 can also be obtained by other techniques. For example, the dry film stripped and copper etched first core layer 62 of FIG. 16 can be obtained by CNC milling. A CNC machine can follow the predetermined pattern to mill off the unwanted areas of the first copper layer 36. After the milling, the first core layer 62 can be cleaned.

Figure 17:
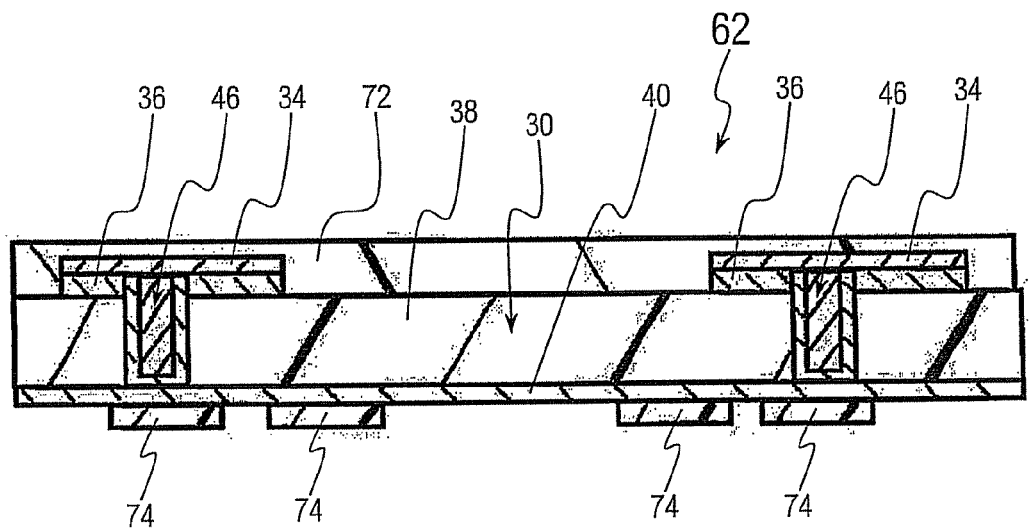
FIG. 17 illustrates a sectioned side view of the first core layer material being applied with photoresist films at a second time.

FIG. 17 illustrates a sectioned side view of the first core layer material 62 being applied with photoresist films at a second time. The first core layer material 62 includes a complete coverage of a second top photoresist 72 on the topside of the first core layer 36 and the PET layer 38. The second top photoresist 72 is provided with a flat and smooth surface. The first core layer material 62 is also provided with a second bottom photoresist 74 on the bottom side of the first core layer 30. The second bottom photoresist 74 includes a predetermined pattern in patches form. The patches of the second bottom photoresist 74 are provided with gaps for dividing the patches. The second bottom patches are also provided with uniform thickness.

The second top photoresist 72 and the second bottom photoresist 74 are both very viscous polymer as a positive type of photoresist. The second top photoresist 72 and the second bottom photoresist 74 are a same type of material as the photoresist of the first top photoresist film 68 and the first bottom photoresist film 70.

A process 160 of applying photoresist films onto the first core layer material at a second time includes providing a second photoresist to both the topside of the first core layer material 62 and to the bottom side of the first layer material 62. Both the topside and the bottom side of the first core layer material 62 are covered by the second photoresist. In particular, the second photoresist is provided onto the bottom side of the first layer material 62 over a mask such that only part of the bottom side of the first layer material 62 is covered by the second photoresist. The second photoresist is cured for a predetermined period of time. The resulted first core layer material 62 then has the configuration as illustrated in FIG. 17.

Figure 18:
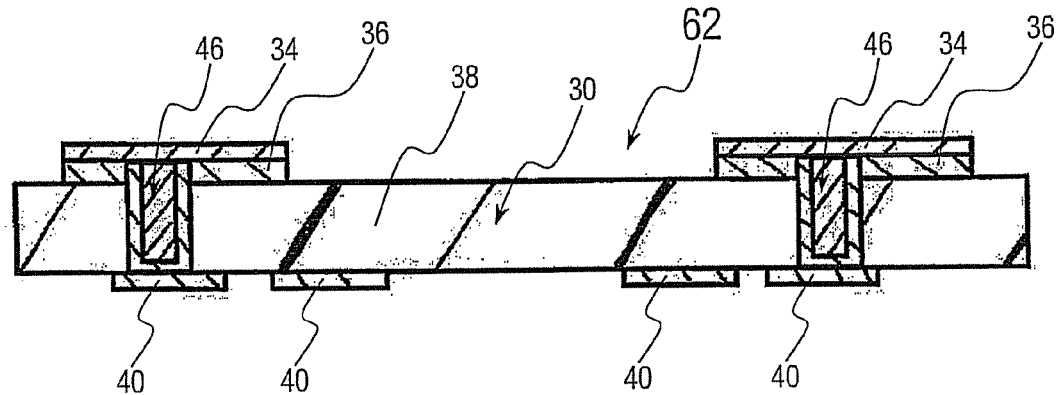
FIG. 18 illustrates a sectioned side view of the first core layer having parts of the second copper layer removed.

FIG. 18 illustrates a sectioned side view of the first core layer having parts of the second copper layer removed. The first core layer material 62 includes the first contact layer 36, the parts of first copper layer 36, parts of second copper layer 40. Some of the parts of the second copper layer 40 are connected to the parts of the first copper layer 36 by the blind vias 46 respectively. The parts of the second copper layer 40 are provided in a predetermined pattern. The parts of the second copper layer 40 are also provided with a uniform thickness.

A process 170 of removing the parts of the second copper layer 40 includes etching and dry film stripping. Firstly, the first core layer material 62 of FIG. 17 is applied with $FeCl_3$ acid onto exposed areas of the second copper layer 40. The $FeCl_3$ acid is applied onto the exposed areas for a predetermined period of time. The $FeCl_3$ acid is removed away and the first core layer material 62 is cleaned when the exposed parts of second copper layer 40 are dissolved away. The first core layer material 62 is subsequently sent for dry film stripping for removing the second photoresist. Similar descriptions related to FIG. 15 on dry film stripping are incorporated here by reference. The dry film stripped first core layer material 62 is illustrated in FIG. 18.

Figure 19:
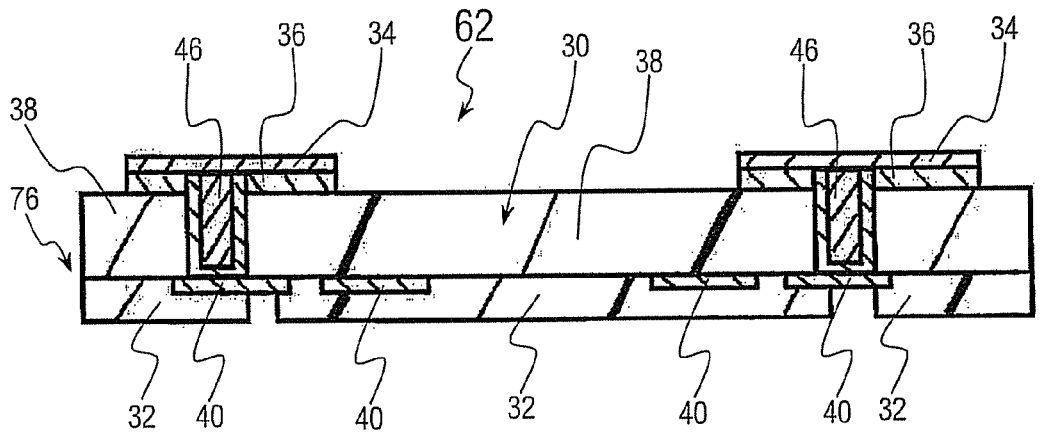
FIG. 19 illustrates a sectioned side view of a dual core substrate material with the first core layer material and a second core layer.

FIG. 19 illustrates a sectioned side view of a dual core substrate material 76 with the first core layer material 62 and the second core layer 32. The second core layer 32 is provided on bottom of the second core layer material 62 with uniform thickness. The second core layer 32 includes a predetermined pattern such that there are openings provided on the second core layer 32. The second core layer 32 is provided over a bottom side of the first core layer material 62. Some parts of the second copper layer 40 are covered by the second core layer 32, while remaining parts of the second copper layer 40 are exposed by the openings. The first contact layer 34 and the first copper layer 36 are at an opposite side of the second core layer 32.

A process 180 of providing the second core layer 32 includes depositing surface mount material onto the second copper layer 40 by chemical vapor deposition (CVD). In the process 180, the second copper layer 40 and the PET layer 38 are exposed to one or more volatile precursors, which react and/or decompose on the bottom surface of the first core layer material 62 to produce the desired deposit. Volatile byproducts that are also produced during the depositing process are removed by gas flow through the reaction chamber. The process 180 provides a layer of surface mount material on both the second copper layer 40 and the PET layer 38. CVD provides the surface mount material with high-purity and high-performance. A mask is later provided on top of the deposited surface mount material. The mask has a predetermined pattern such that an etching process is carried out over the deposited surface mount material by dissolving away parts of the surface mount material that are exposed by the mask. Alternatively, machining process can also be used to remove the parts of deposited material that follow the exposed pattern of the mask. The openings are formed by the etching process or the machining process.

Figure 20:
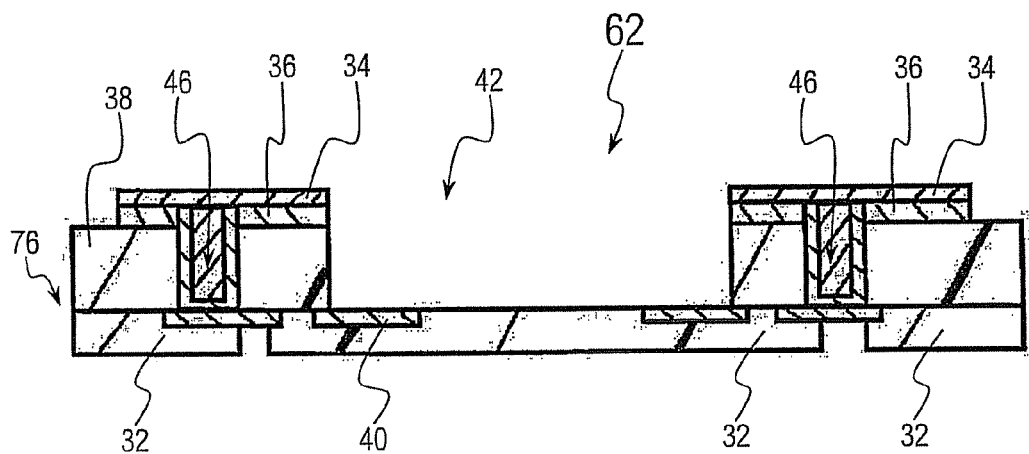
FIG. 20 illustrates a sectioned side view of the dual core substrate material formed with a cavity.

FIG. 20 illustrates a sectioned side view of the dual core substrate material 76 formed with the cavity 42. The dual core substrate material 76 includes the cavity 42 in a central position and the cavity 42 resembles a well opening towards top. The cavity 42 exposes the second copper layer 40 in the central position and exposed part of the second copper layer 40 is provided as a base for the cavity 42.

The cavity 42 reduces a thickness of the dual core substrate material 76 in the central position. In other words, the thickness of the dual core substrate material 76 in the central position is reduced to be the thickness of the second core layer 62. Surrounding materials of the cavity 42 remain unaffected and provide supporting structures of the dual core substrate material 76. In an alternative, the cavity 42 can be in shapes that are capable of receiving a semiconductor chip. For example, the cavity 42 can be replaced by a rectangular shaped cavity, a cylindrical shaped cavity, or other polygon shaped cavities, etc.

The cavity 42 is formed by a process 190 of half routing, which is a form of end milling. The end milling is performed by a CNC machine programmed with a predetermined pattern of the cavity such that the CNC machine mills materials off the dual core substrate material 76 to form the cavity 42.

Figure 21:
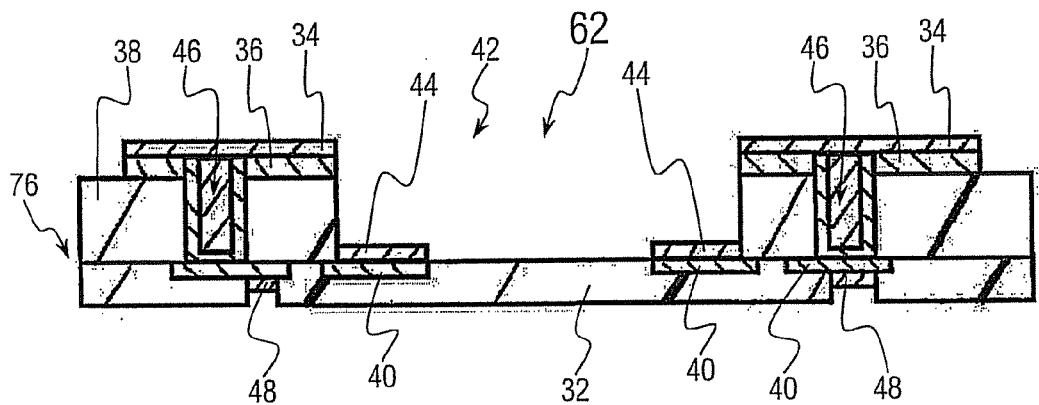
FIG. 21 illustrates a sectioned side view of the dual core substrate material with a second contact layer and a third contact layer.

FIG. 21 illustrates a sectioned side view of the dual core substrate material 76 with the second contact layer 44 and the third contact layer 48. The second contact layer 44 is made of Nickel-Gold. The second contact layer 44 covers the part of second copper layer 40 that is exposed by the cavity 42. The third contact layer 48 is also made of Nickel-Gold. The third contact layer 48 covers parts of the second copper layer 40 that is exposed by the second core layer 32.

The second contact layer 44 provides an additional electrical conductive layer that covers second copper layer 40. Similarly, the third contact layer 48 provides an additional electrical contact layer to the second copper layer 40 at bottom. The Nickel-Gold material of the second contact layer 44 and the third contact layer 48 prevents corrosion and contamination that can adversely affect electrical connectivity of the second copper layer 40.

The second contact layer 44 and the third contact layer 48 are provided by a process 200 of plating. Similar to the plating of first contact layer 34, depositing of second contact layer 44 and the third contact layer 48 can be preceded by providing a Nickel layer for improving adhesion of the second copper layer 40. The Nickel-Gold material of the second contact layer 44 and the third contact layer 48 also eases gold wire bonding.

Figure 22:
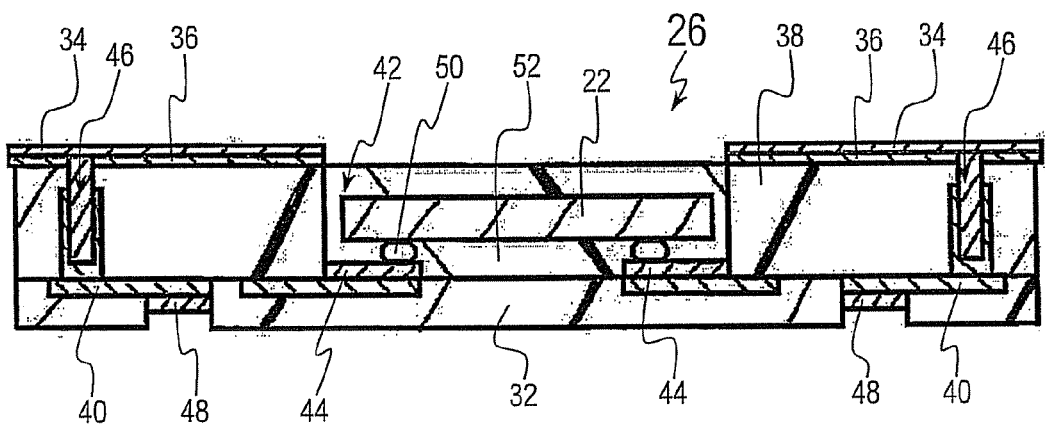
FIG. 22 illustrates a sectioned side view of the dual core substrate mounted with a memory chip.

FIG. 22 illustrates a sectioned side view of the dual core substrate 26 mounted with the memory chip 22. The memory chip 22 is provided by a process 210 of mounting using flip-chip mounting technique. A plurality of solder balls 50 is provided between the memory chip 22 and the second contact layer 44 for connecting the memory chip 22 to the second contact layer 44. The mounting process 210 further includes a process of filling voids with the glue 52 between the cavity 42 and the memory chip 22.

The glue 52 can be replaced by another molding compound. The molding compound can be a type of ceramic, plastic, or epoxy to prevent physical damage or corrosion to the memory chip 22.

Figure 23:
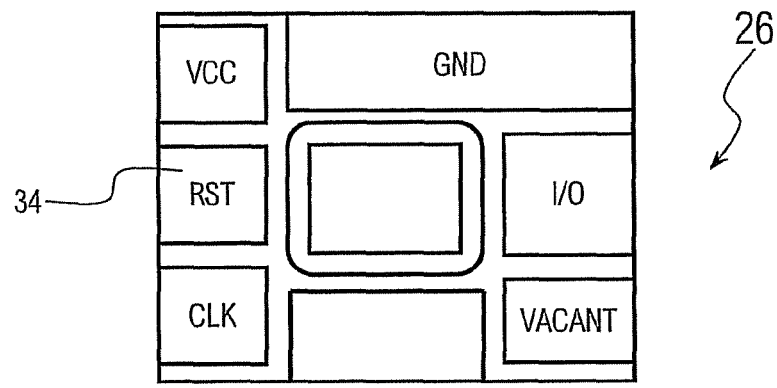
FIG. 23 illustrates a corresponding top view of the chip package of FIG. 22.

FIG. 23 illustrates a top view of the dual core substrate 26 packaged with the memory chip 22. The memory chip 22 is exposed in the top view to be substantially square in shape. The memory chip 22 is provided in a central position of the top view and is surrounded by the first contact layer 34. The first contact layer 34 is divided into seven patches in the illustrated embodiment. Each of these patches is connected to at least one of the blind vias 46 underneath, and each of these patches is provided as one electrical terminal.

The first contact layer 34 is thin and resistive to contamination or scratches. The first contact layer 34 is provided as compact electrical terminals. In other words, the six patches are provided as an interface of the chip package 20. According to the embodiment illustrated in FIG. 24, six patches are used for the terminals, which include a terminal of voltage supply (VCC), a terminal of ground (GND), a terminal of input/output (I/O), a vacant terminal, a clock terminal (CLK) and a reset (RST) terminal respectively. The six patches are electrically connected to the first copper layer 36, the blind vias 46, the second copper layer 40 and the third contact layer 48 accordingly.

Figure 24:
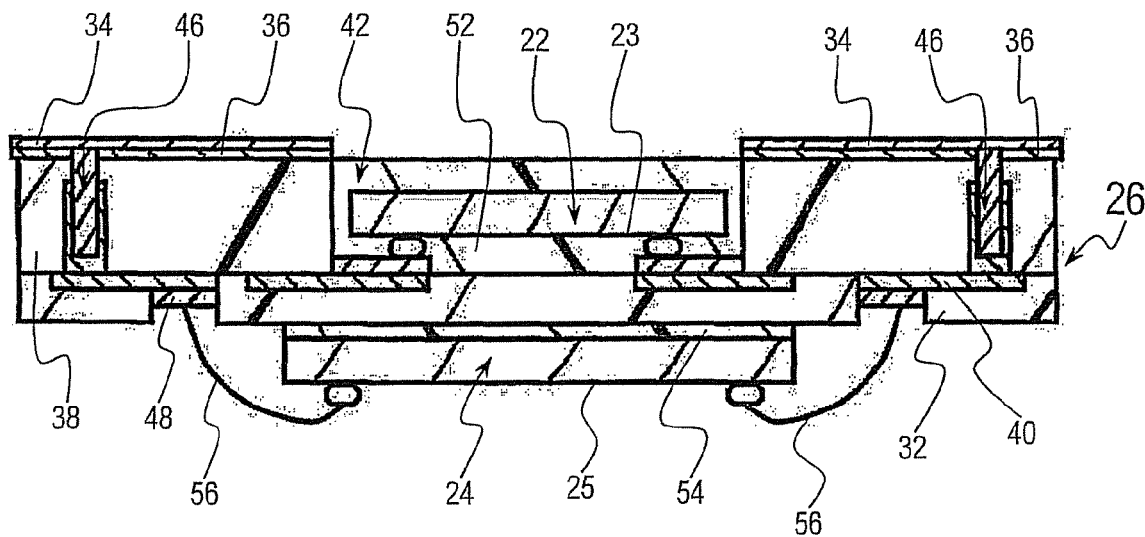
FIG. 24 illustrates a sectioned side view of the dual core substrate mounted with a controller chip.
Figure 25:
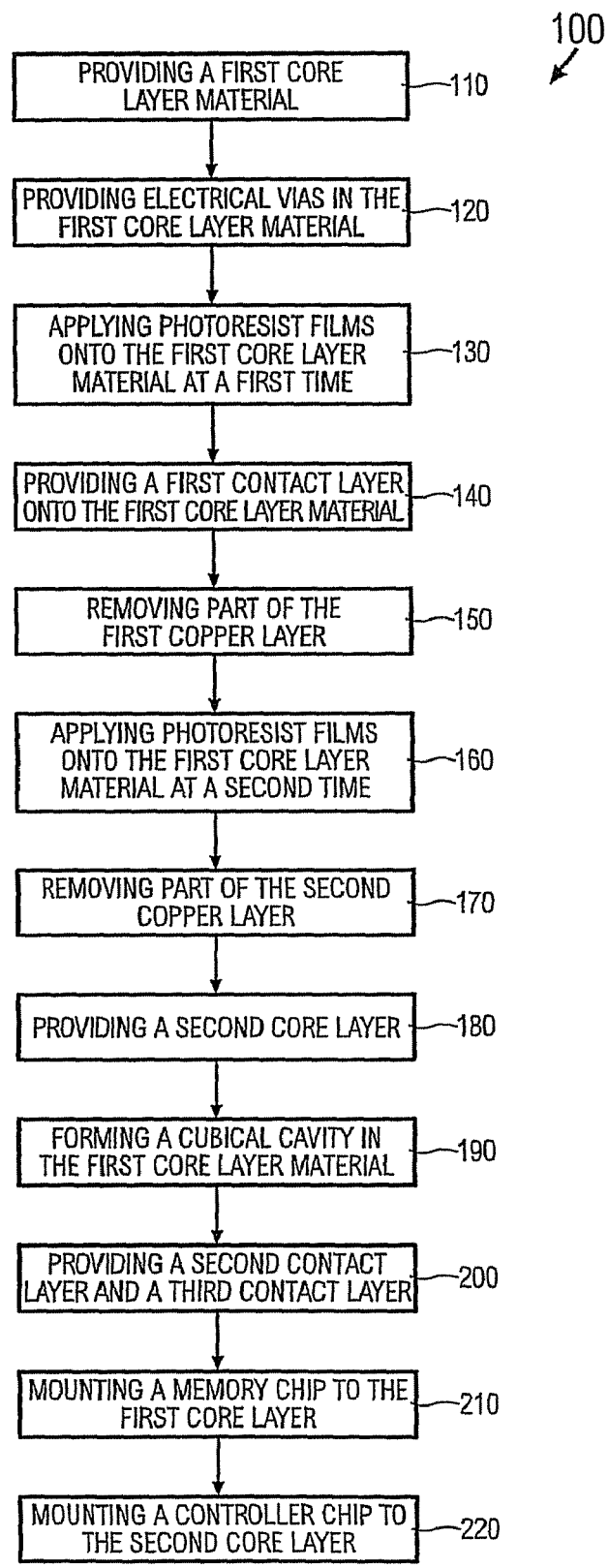
FIG. 25 illustrates a summary of manufacturing processes for making the chip package for a smart card.

FIG. 24 illustrates a sectioned side view of the dual core substrate 26 mounted with the controller chip 24. The die bonding adhesive 54 is provided on a bottom surface of the second core layer 32. The die bonding adhesive 54 is further provided at a central position of the second core layer 32. As illustrated FIG. 24, the die bonding adhesive 54 is surrounded by the third contact layer 48. The controller chip 24 is closely attached to the die bonding adhesive 54. The controller chip 24 is also connected to the third contact layer 48 by the plurality of bond wires 56.

The second core layer 32 is provided between the memory chip 22 and the controller chip 24. In other words, the memory chip 22 and the controller chip 24 are both protected and supported by the second core 32. Possibilities of die cracking of the memory chip 22 and of the controller chip 24 are reduced. Electrical connections between the memory chip 22 and the controller chip 24 are also shortened by sharing a common base of the second copper layer 40.

The controller chip 24 is provided by a process 220 of mounting the controller chip 24. In the process 220, the die bonding adhesive 54 is firstly provided onto the central bottom area of the second core layer 32. The controller chip 24 is subsequently attached onto the die bonding adhesive 54. The plurality of bond wires 56 is soldered between the controller chip 24 and the third contact layer 48 according to a predetermined pattern. The controller chip 24 is also encapsulated by the molding compound 58 to form the chip package 20. The molding compound 58 covers the controller chip 24, the bond wires 56, and the third contact layer 48 with the molding compound 58. Peripheries of the second core layer 32 are exposed by the molding compound 58. The molding compound 58 is an epoxy compound, which can also be replaced by ceramic or plastic. The packaged chip package 20 is illustrated in FIG. 7.

Figure 26:
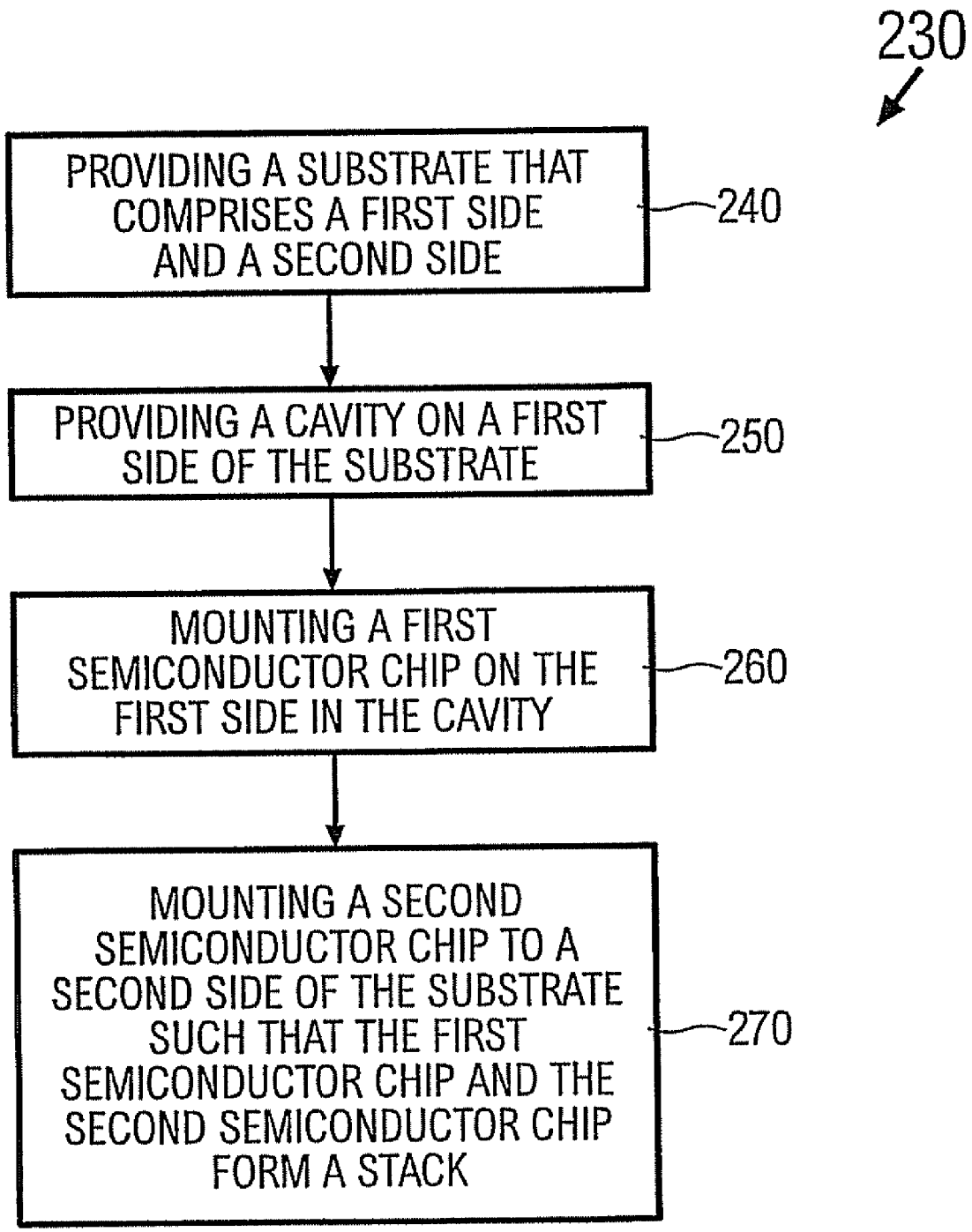
FIG. 26 provides an alternative illustration of the manufacturing processes for making the chip package.

FIG. 25 illustrates a summary of manufacturing processes 100 for making the chip package 20. These processes 100 have already been described in relation to FIGS. 11-24. These processes 100 can be changed in sequence depending on process requirements. FIG. 26 provides an alternative illustration of the manufacturing processes 230 for making the chip package 20. The manufacturing processes 230 include the process 240 of providing a substrate 12 that has a first side 14 and a second side 16, the process 250 of providing a cavity 42 on the first side 14 of the substrate 12, the process 260 of mounting a first semiconductor chip 22 in the cavity 42, and the process 270 of mounting a second semiconductor chip 24 to a second side 16 of the substrate 16 such that the first semiconductor chip 22 and the second semiconductor chip 24 form a stack.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit package comprising:
a substrate having a cavity opening to a first side of the substrate,
a conductive layer at a second side of the substrate forming a base of the cavity,
a contact layer on the conductive layer and situated in the cavity,
a first semiconductor chip, the first semiconductor chip being provided in the cavity and electrically connected to the contact layer by a plurality of solder balls,
a second semiconductor chip, the second semiconductor chip being provided on a second side of the substrate, and
wherein the first semiconductor chip and the second semiconductor chip form a stack.

2. The integrated circuit package of claim 1, wherein at least a portion of the substrate is provided between the first semiconductor chip and the second semiconductor chip.

3. The integrated circuit package of claim 1, wherein the first semiconductor chip is encapsulated in the cavity by a molding compound.

4. The integrated circuit package of claim 1, wherein the first semiconductor chip includes a different electronic function from an electronic function of the second semiconductor chip.

5. The integrated circuit package of claim 1 further comprising a first contact layer, the first contact layer being provided on the first side of the substrate.

6. The integrated circuit package of claim 5 further comprising:
electrical connecting elements that are connected to the first semiconductor chip, the second semiconductor chip, and the first contact layer.

7. The integrated circuit package of claim 6, wherein the electrical connecting elements include electrical vias.

8. The integrated circuit package of claim 1, wherein the second semiconductor chip is electrically connected to the contact layer by bond wires and the conductive layer.

9. The integrated circuit package of claim 1, wherein first and second patches at opposite edges of the second side of the substrate are exposed to provide access to the conductive layer.

10. The integrated circuit package of claim 1, further comprising an encapsulating material filling the cavity and separating the first semiconductor chip from a plurality of contact layers situated on the first side of the substrate.

11. An integrated circuit package comprising:
a carrier element having a cavity opening to a first side of the carrier element,
a conductive layer at a second side of the carrier element forming a base of the cavity,
a first contact layer situated on the first side of the carrier element,
a second contact layer on the conductive layer and situated in the cavity,
a first semiconductor chip, the first semiconductor chip being provided in the cavity and electrically connected to the first contact layer by a plurality of solder balls,
a second semiconductor chip, the second semiconductor chip being provided on a second side of the carrier element, and
wherein the first semiconductor chip and the second semiconductor chip form a stack.

12. The integrated circuit package of claim 11, wherein the carrier element comprises a substrate.

13. The integrated circuit package of claim 12 further comprising an encapsulating material filling the cavity and separating the first semiconductor chip from the first contact layer.

14. The integrated circuit package of claim 11, wherein the carrier element comprises a first core layer and a second core layer that are attached to each other.

15. The integrated circuit package of claim 14, wherein the second core layer has first and second exposed patches to provide access to the conductive layer.

16. The integrated circuit package of claim 15 further comprising a plurality of electrical vias that connects the first contact layer and the second contact layer.

* * * * *